United States Patent [19]
Robertson

[11] Patent Number: 5,266,959
[45] Date of Patent: Nov. 30, 1993

[54] INTRA-ARRAY TEST PROBE

[75] Inventor: Edward L. Robertson, Culver City, Calif.

[73] Assignee: Hughes Aircraft Company, Los Angeles, Calif.

[21] Appl. No.: 766,468

[22] Filed: Sep. 26, 1991

[51] Int. Cl.$^5$ ............................................ G01R 29/08
[52] U.S. Cl. ...................................... 343/703; 343/841
[58] Field of Search ............... 343/703, 841; 455/67.1, 455/266.1

[56] References Cited

U.S. PATENT DOCUMENTS

| | | | |
|---|---|---|---|
| 2,490,782 | 4/1946 | Collup | 343/703 |
| 2,988,740 | 6/1961 | Albanese | 343/703 |
| 4,468,669 | 8/1984 | Wang et al. | 343/703 |

Primary Examiner—Michael C. Wimer
Assistant Examiner—Tan Ho
Attorney, Agent, or Firm—L. A. Alkov; W. K. Denson-Low

[57] ABSTRACT

In an electronically scanned array where each radiating element extends outwardly from a face of the array (10), an intra-array test probe (20) is employed to test the propagation characteristics of an individual radiating element (13). The intra-array test probe (20) is adapted to be removable fitted over the radiating element (13) at one end and coupled to a test instrument at the other end. The intra-array test probe (20) channels RF signals to or from the test instrument to the radiating element (13) under test to test the propagation characteristics of the radiating element.

18 Claims, 4 Drawing Sheets

INTRA-ARRAY TEST PROBE

BACKGROUND OF THE INVENTION

1. Field of the Invention

This invention relates to testing of electronic components and, more particularly, a system and method for determining the propagation characteristics of radiating elements in an electronically scanned array.

2. Description of Related Art

Electronically scanned arrays are used in many antenna applications, and their users require accurate and efficient testing systems to maintain and calibrate them. These arrays can be large and may require special shipping containers to move them. Moving such an array may be costly in time, equipment and labor.

One wishing to test the propagation characteristics of radiating elements in an electronically scanned array may choose between various methods known to the art. Methods using receive horns and far field ranges are suitable for testing an electronically scanned array as a whole; however, these methods are not practical for testing individual radiating elements. These methods may also require moving the electronically scanned array into a special testing facility. Methods using near field methods can test individual radiating elements, but require complex test equipment to control the near field probe and require moving the electronically scanned array to a near field facility.

While the prior techniques have a variety of drawbacks, one of their primary disadvantages is that they are generally not very portable and no known technique is available whereby test equipment is designed to be portable enough to be taken to the electronically scanned array for on-sight testing.

SUMMARY OF THE INVENTION

Pursuant to the present invention, an intra-array test probe is used to test the propagation characteristics of individual radiating elements in an electronically scanned array. The intra-array test probe is adapted to be removable fitted over the radiating element under test at one end and coupled to a test instrument at the other end. The intra-array test probe channels RF signals to or from the test instrument to the radiating element under test to test the propagation characteristics of the radiating element.

BRIEF DESCRIPTION OF THE DRAWINGS

The various advantages of the present invention will become apparent to those skilled in the art after studying the following specification and by reference to the drawings in which.

DESCRIPTION OF THE PREFERRED EMBODIMENT

Figure 1:
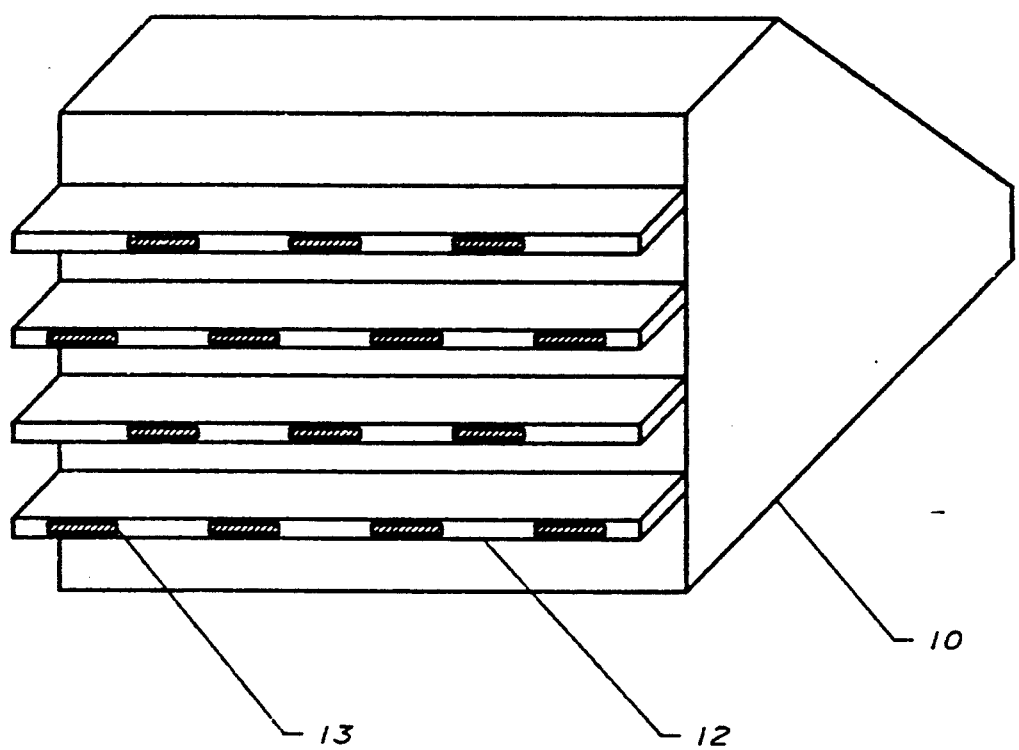
FIG. 1 is a perspective view of an electronically scanned array.

In an array antenna where each radiating element extends outwardly from the array face, the present invention can be used to test the propagation characteristics of individual radiating elements. FIG. 1 is a diagram depicting one such application, a planar electronically scanned array. Electronically scanned arrays commonly use a sum port to make the received signal, collected from all the radiating elements in the array, available to a receiver unit. When transmitting, a separate transmitting port is typically used to couple the electronically scanned array to a high power transmitter. Many electronically scanned arrays use phase shifter assemblies to create phase differences between radiating elements to steer the beam when transmitting. In this example, the radiating elements 13 are placed in lines with each radiating element 13 abutting the adjacent radiating elements in the line to form a fin 12. The fin 12 forms a continuously conducting structure.

Figure 2A:
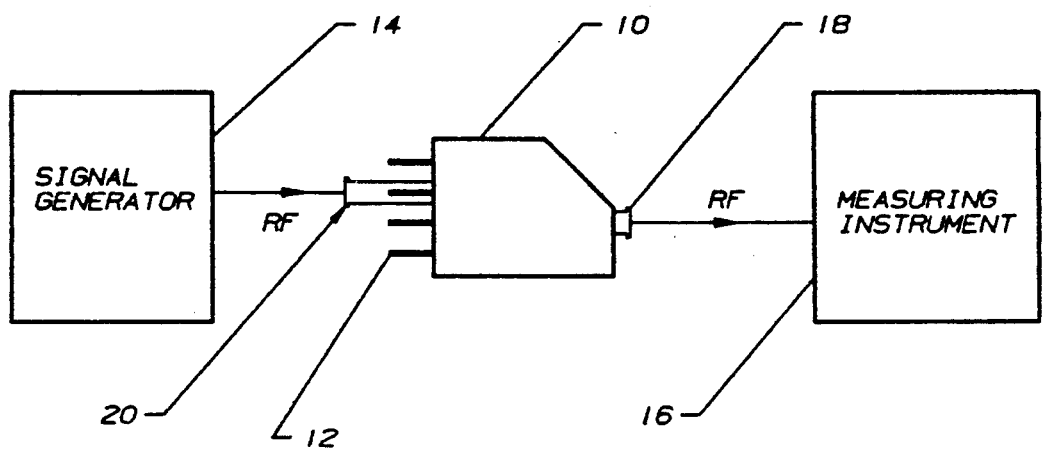
FIG. 2a is a functional block diagram of a system made in accordance with the teachings of this invention.

FIG. 2a is a functional block diagram of one application showing the electrical and physical connections between the elements of the present invention and the electronically scanned array 10. The signal generator 14 provides radio frequency (RF) signals that are channelled into an individual radiating element within a fin 12 by the intra-array test probe 20. The intra-array test probe 20 isolates the radiating element under test so that no RF signals are propagated through any of the other radiating elements in the electronically scanned array 10. A measuring instrument 16 is used to measure parameters of the RF signals at the electronically scanned array's sum port 18, after they have been propagated through the radiating element under test. These measurements are used to determine the propagation characteristics of the radiating element under test and its associated variable phase shifter assemblies.

Figure 2B:
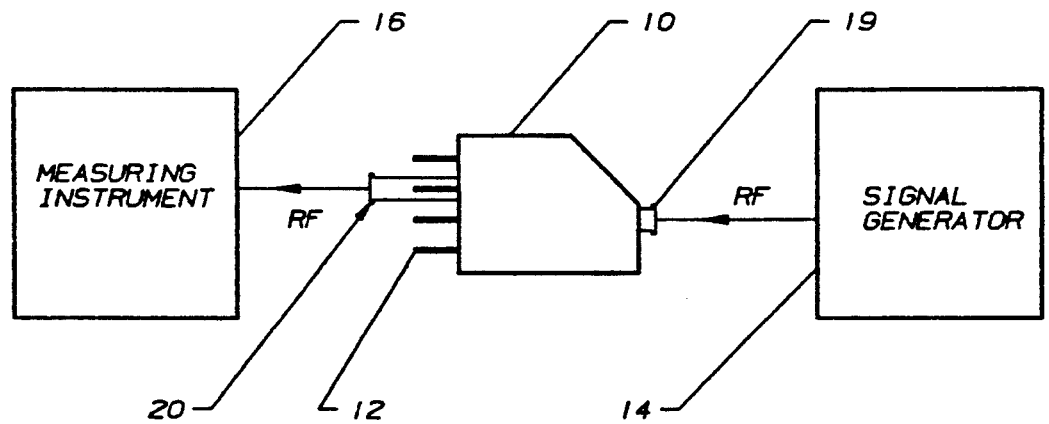
FIG. 2b is a functional block diagram of an alternative system made in accordance with the teachings of this invention.

Although this application is shown using the present invention to test the receive path of the radiating element, the system can also be used to test the transmit path of the radiating element. For example, the signal generator can be coupled to the electronically scanned array's transmitter port 19 and the measuring instrument coupled to the intra-array test probe. This application is illustrated in FIG. 2b.

Figure 3:
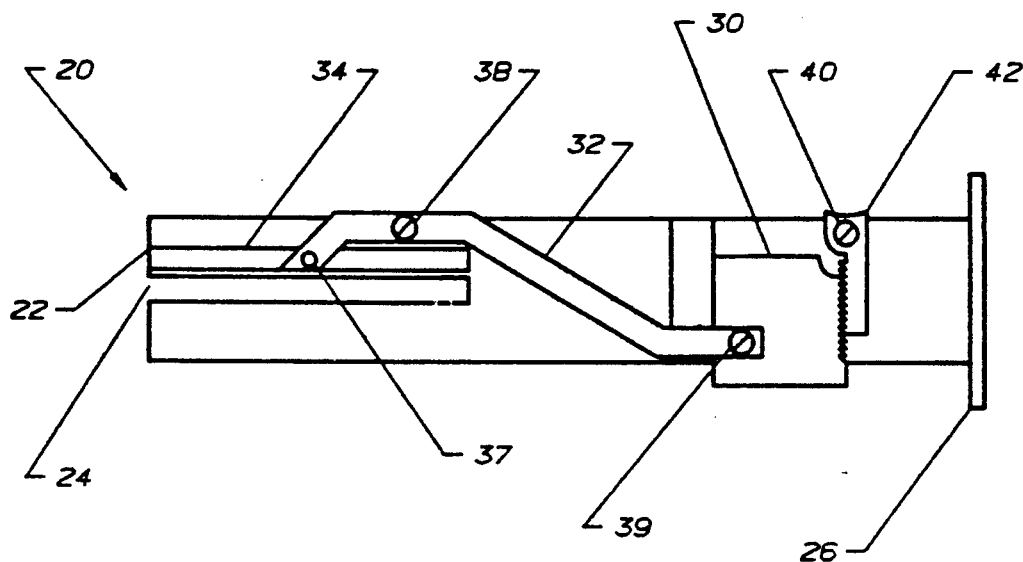
FIG. 3 is a side view of an intra-array test probe made in accordance with the teachings of this invention.
Figure 4:
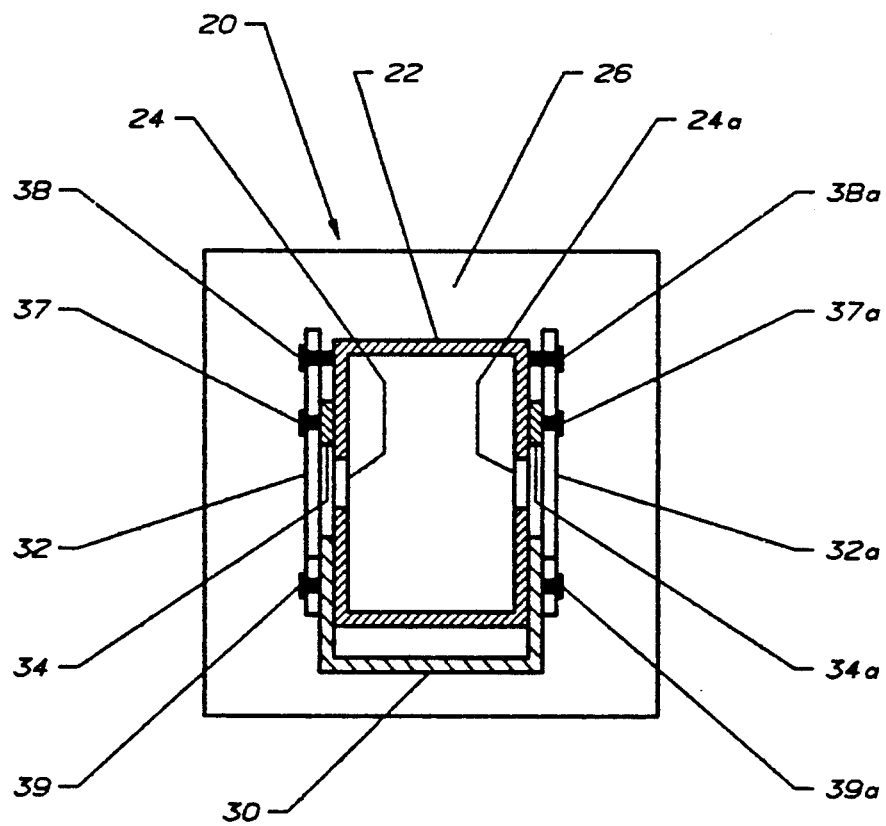
FIG. 4 is a front view of the intra-array test probe shown in FIG. 3.

FIG. 3 is a side view of one embodiment of an intra-array test probe 20 made in accordance with the teachings of the preferred embodiment of the present invention. This intra-array test probe 20 was constructed out of a six inch length of standard WR-90 rectangular waveguide 22 with slots 24 cut along the the center of each broadside wall at one end. The slots 24 are 2.300 inches long and 0.175 inches wide. The waveguide 22 has a flange 26 at the opposite end. Slide ratchet 30, connecting arm 32, and conductive plate 34 are constructed out of 0.063 inch thick stainless steel sheet stock. As illustrated in FIG. 4, the intra-array test probe 20 has two conductive plates, and two connecting arms connected to a single "U shaped" slide ratchet. The conductive plates 34 and 34a physically contact the waveguide 22. The conductive plates 34 and 34a are connected to connecting arms 32 and 32a, respectively, at pivoting connection points 37 and 37a, respectively. Each connecting arm 32 is connected to the waveguide 22 at pivot point 38. The slide ratchet is connected to each connecting arm 32 and 32a at pivoting connection points 39 and 39a, respectively. Slide ratchet release 40 is connected to the waveguide 22 at pivoting connection point 42.

FIG. 4 is a front view of the intra-array test probe 20. This view shows the conductive plate 34a and connecting arm 32a used on the side not visible in FIG. 3. Moving slide ratchet 30 closes the slots on both sides of the intra-array test probe 20.

Referring to FIGS. 3 and 4, the intra-array test probe 20 is operated as follows: The intra-array test probe 20 is fitted to a radiating element 13 by positioning the intra-array test probe 20 so that the fin 12 fits into the slots 24 and 24a. Since the slots 24 and 24a are centered on the broadside wall of waveguide 22, the intra-array test probe 20 is centered on the radiating element 13 in the vertical axis. In this embodiment, the user positions the intra-array test probe 20 on the horizontal axis by sight. The user only has to roughly center the intra-array test probe 20 on the horizontal axis to propagate RF signals into the radiating element 13. To clamp the intra-array test probe 20 to the radiating element 13, the slide ratchet 30 is moved upwards. The connecting arm 32 serves as a lever, pivoting around pivot point 38. Moving slide ratchet 30 upwards, by lever action, moves conductive plates 34 and 34a downwards. The conductive plates 34 and 34a slide downwardly, remaining in contact with waveguide 22 to cover the slots 24 and 24a. When the slide ratchet 30 is moved upwards sufficiently, the conductive plates 34 and 34a contact the fin 12. The ratchet mechanism of the slide ratchet 30 prevents the conductive plates 34 and 34a from moving away from the radiating element 13, thereby clamping the intra-array test probe 20 onto it and reducing RF signal leakage from the slots. The intra-array test probe 20 is unclamped from the radiating element 13 by rotating slide ratchet release 40 counter-clockwise around pivoting connection point 42.

Figure 5:
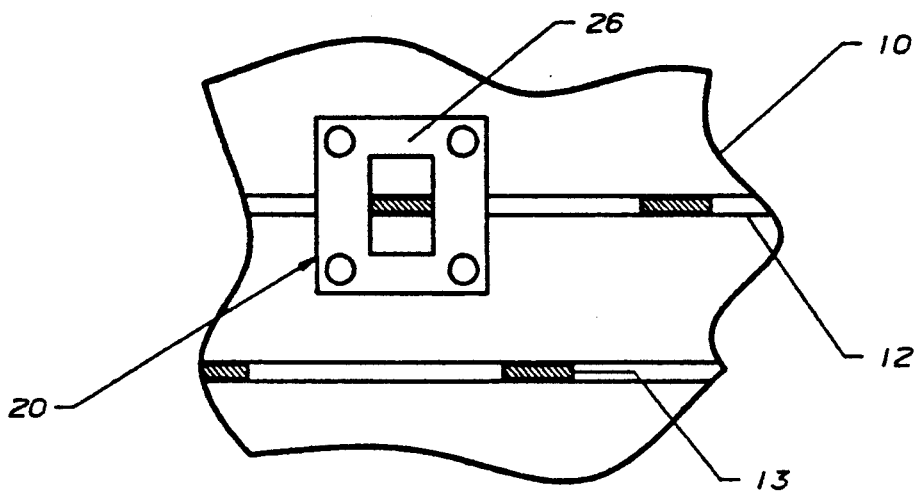
FIG. 5 is a front view of the electronically scanned array with the intra-array test probe fitted to a radiating element.
Figure 6:
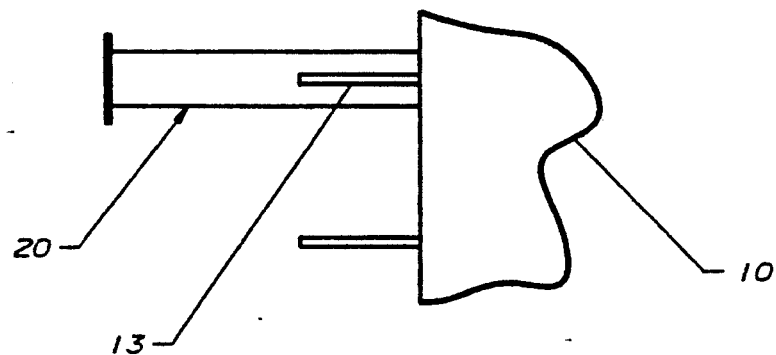
FIG. 6 is a side view of the electronically scanned array with the intra-array test probe fitted to a radiating element.
Figure 7:
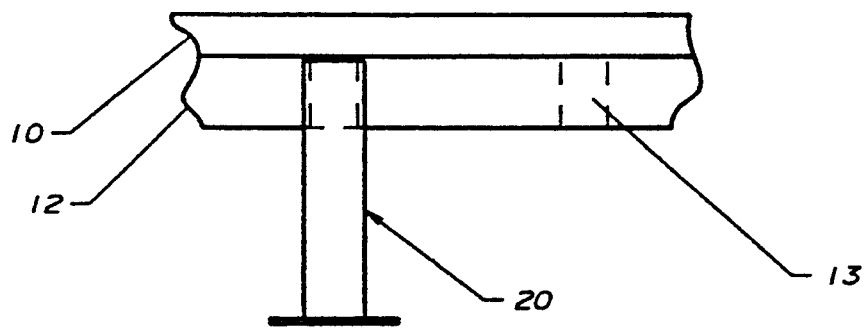
FIG. 7 is a top view of the electronically scanned array with the intra-array test probe fitted to a radiating element.

FIGS. 5, 6, and 7 illustrate the intra-array test probe 20 fitted to a radiating element 13 within a fin 12. The slide ratchet, connecting arms, and conductive plates on the intra-array test probe 20 have been omitted for clarity. FIG. 5 shows an intra-array test probe 20 fitted to a radiating element 13, viewed looking at the face of the electronically scanned array 10. FIG. 6 is a side view of the electronically scanned array 10, with the intra-array test probe 20 fitted to a radiating element 13. FIG. 7 is a top view of the electronically scanned array 10 with the intra-array test probe 20 fitted to a radiating element 13. The dashed lines show individual radiating elements with a fin 12.

Thus, as described in the preferred embodiment, the intra-array test probe 20 can be used to channel RF test signals from the signal generator 14 into the radiating element under test 13 without allowing leakage into other radiating elements. The RF test signals propagate through the radiating element 13 and are measured at the electronically scanned array sum port 18 by measuring instrument 16. These measurements are used to determine the propagation characteristics of radiating element 13.

For example, the variable phase shifter associated with a radiating element 13 can be tested as follows: The variable phase shifter is set to 0° before sending the RF test signal into the radiating element 13. At the sum port 18, the RF test signal is measured and recorded by measuring instrument 16. The variable phase shifter is commanded to a different angle and the measuring instrument 16 then measures the relative phase difference using the 0° test signal as a reference. A network analyzer can be used as the measuring instrument 16 to measure the relative phase difference over a band of frequencies.

The intra-array test probe 20, which is small and portable and used in conjunction with a signal source 14 and measuring instrument 16, can easily be brought to an electronically scanned array 10 to test the propagation characteristics of individual radiating elements 13. This system and method avoids the expense and time delay involved with crating and shipping an electronically scanned array 10 to a special testing facility as typically required by the prior art. Furthermore, the preceding description of the preferred embodiment was provided as an illustration of one manner in which to practice the invention. For example, the size and shape of the intra-array test probe 20 can be tailored to fit within a particular array lattice, or different clamping or slot closing mechanisms can be employed. Design specific modifications could be performed using ordinary skill in the art without departing from the spirit and scope of the invention.

What is claimed is:

1. In an array antenna where each radiating element extends outwardly from the face of the array and has phase shifters to electronically scan the array, a system for testing the propagation characteristics of individual radiating elements, the system comprising:

an intra-array test probe, adapted to be revocably fitted over a radiating element under test at one end and coupled to a test instrument at the other end, the intra-array test probe further including:

a tube with a conductive inner surface serving as a waveguide for propagating RF signals to or from the radiating element under test;

the tube having slots in one end of said tube so that the tube fits over the radiating element, as well as position the tube to propagate RF signals to or from the radiating element;

the tube fits over the radiating element and isolates it from the other radiating elements in the array; and coupling means, at the other end of the tube, adapted for coupling the tube to a test instrument.

2. The system of claim 1 further comprising:

generating means, coupled to the intra-array test probe, for generating RF signals to be channeled into the radiating element under test; and measuring means, coupled to an electronically scanned array's sum port, for measuring characteristics of RF signals propagated through the radiating elements.

3. The system of claim 1 further comprising:

measuring means, coupled to the intra-array test probe, for measuring RF signals propagated through the radiating element under test; and generating means, coupled to an electronically scanned array's transmitter port, for generating RF signals to be propagated through the radiating element.

4. The system of claim 1 wherein the coupling means is a flange.

5. The system of claim 1 wherein the intra-array test probe further comprises a clamping means for detachably clamping the intra-array test probe to the radiating element under test.

6. The system of claim 1 wherein the intra-array test probe further comprises closing means for closing the slots around the radiating element under test so as to reduce RF energy leakage while the system is in use.

7. The system of claim 6 wherein the closing means detachably clamps the intra-array test probe to the radiating element under test.

8. The system of claim 7 wherein the closing means comprises:
   a slide ratchet assembly;
   connecting arms, each connected to the slide ratchet assembly at a first connecting point on the arm, and to the tube at a second connecting point on the arm;
   conductive plates, each connected to a connecting arm at a third connecting point on the arm, the conductive plates shaped to cover the slots and clamp down on the radiating element under test when the slide ratchet assembly is engaged; and
   wherein the first, second and third connecting points are pivoting connecting points.

9. In an array antenna where each radiating element extends outwardly from the face of the array and has phase shifters to electronically scan the array, a system for testing the propagation characteristics of individual radiating elements, the system comprising:
   an intra-array test probe, adapted to be revocably fitted over a radiating element under test at one end and coupled to a test instrument at the other end, the intra-array test probe further including:
   a tube with a conductive inner surface serving as a waveguide for propagating RF signals to or from the radiating element under test;
   the tube having slots in one end of said tube so that the tube fits over the radiating element, as well as position the tube to propagate RF signals to or from the radiating element;
   the tube fits over the radiating element and isolates it from the other radiating elements in the array;
   coupling means, at the other end of the tube, adapted for coupling the tube to a test instrument;
   closing means for closing the slots around the radiating element under test so as to reduce RF energy leakage while the system is in use; and
   wherein the closing means detachably clamps the intra-array test probe to the radiating element under test.

10. The system of claim 9 further comprising:
    generating means, coupled to the intra-array test probe, for generating RF signals to be channelled into the radiating element under test; and
    measuring means, coupled to an electronically scanned array's sum port, for measuring characteristics of RF signals propagated through the radiating element.

11. The system of claim 9 further comprising:
    measuring means, coupled to the intra-array test probe for measuring RF signals propagated through the radiating element under test; and
    generating means, coupled to an electronically scanned array's transmitter port, for generating RF signals to be propagated through the radiating element.

12. The system of claim 9 wherein the coupling means is a flange.

13. The system of claim 9 wherein the closing means comprises:
    a slide ratchet assembly;
    connecting arms, each connected to the slide ratchet assembly at a first connecting point on the arm, and to the tube at a second connecting point on the arm;
    conductive plates, each connected to a connecting arm at a third connecting point on the arm, the conductive plates shaped to cover the slots and clamp down on the radiating element under test when the slide ratchet assembly is engaged; and
    wherein the first, second and third connecting points are pivoting connecting points.

14. In an electronically scanned array where each radiating element extends outwardly from a face of the array, a method for testing the propagation characteristics of individual radiating elements, the method comprising:
    detachably coupling an intra-array test probe to individual radiating elements;
    coupling a test instrument to said probe to propagate RF signals to or from the test instrument into or out of a radiating element under test, respectively;
    generating RF signals from a generating means to be propagated through the radiating element under test;
    measuring parameters of the RF signals propagated through the radiating element to determine the propagation characteristics of the radiating element under test; and
    wherein said probe uses slots cut into the probe to fit and position the probe on the radiating element.

15. The method of claim 14 wherein the intra-array test probe is used to propagate RF signals from the generating means to the radiating element under test; and
    measuring means is coupled to an electronically scanned array's sum port to test the receive path of said radiating element under test.

16. The method of claim 14 where the intra-array test probe is used to propagate RF signals from the radiating element under test to a measuring means; and
    the generating means is coupled to an electronically scanned array's transmitter port to test the transmit path of said radiating element under test.

17. The method of claim 14 wherein said probe includes a closing means for closing the slots around the radiating element under test to reduce RF energy leakage.

18. The method of claim 17 wherein said closing means clamps the probe to the radiating element under test to keep the probe in one position throughout the test.

\* \* \* \* \*